United States Patent
Nagel

(10) Patent No.: US 12,157,979 B2
(45) Date of Patent: Dec. 3, 2024

(54) SYSTEMS AND METHODS FOR ESTIMATING MATERIAL COMPACTION BASED ON ELECTRIC MOTOR DRIVE POWER

(71) Applicant: Caterpillar Paving Products Inc., Brooklyn Park, MN (US)

(72) Inventor: Brian D. Nagel, Ramsey, MN (US)

(73) Assignee: Caterpillar Paving Products Inc., Brooklyn Park, MN (US)

( * ) Notice: Subject to any disclaimer, the term of this patent is extended or adjusted under 35 U.S.C. 154(b) by 207 days.

(21) Appl. No.: 17/690,946

(22) Filed: Mar. 9, 2022

(65) Prior Publication Data

US 2023/0287638 A1    Sep. 14, 2023

(51) Int. Cl.
| | | |
|---|---|---|
| *E01C 23/01* | (2006.01) | |
| *G01C 9/00* | (2006.01) | |
| *G01R 19/00* | (2006.01) | |
| *G01S 19/01* | (2010.01) | |

(52) U.S. Cl.
CPC ............... *E01C 23/01* (2013.01); *G01C 9/00* (2013.01); *G01R 19/0092* (2013.01); *G01S 19/01* (2013.01)

(58) Field of Classification Search
CPC ......... G01C 9/00; E01C 19/004; E01C 19/40; E01C 19/288; G01N 9/36; G01N 33/24; G01G 19/022; E02F 9/207; E02F 3/405; B60L 1/20; F16H 61/421
See application file for complete search history.

(56) References Cited

U.S. PATENT DOCUMENTS

| | | | | |
|---|---|---|---|---|
| 5,415,494 A | * | 5/1995 | Steffen | G01N 33/24 404/133.05 |
| 6,973,821 B2 | * | 12/2005 | Corcoran | G01N 9/36 73/78 |
| 2007/0150147 A1 | * | 6/2007 | Rasmussen | E01C 19/004 701/50 |
| 2008/0260462 A1 | * | 10/2008 | Ackermann | E01C 19/288 404/124 |
| 2013/0004237 A1 | * | 1/2013 | Krings | E01C 19/288 404/133.05 |
| 2014/0196449 A1 | * | 7/2014 | Petty | F16H 61/421 60/487 |
| 2021/0087758 A1 | * | 3/2021 | Müller | E01C 19/40 |
| 2023/0104698 A1 | * | 4/2023 | Young | E02F 3/405 701/22 |
| 2023/0193594 A1 | * | 6/2023 | Young | B60L 1/20 701/22 |
| 2023/0279641 A1 | * | 9/2023 | Young | E02F 9/207 701/50 |
| 2023/0287634 A1 | * | 9/2023 | Nagel | G01G 19/022 |

* cited by examiner

*Primary Examiner* — Yuri Kan

(57) ABSTRACT

A method for estimating material compaction can include creating compaction lookup tables based on total drive motor current and slope angle for each of a plurality of machine types. The method can include receiving telematics data related to total drive motor current for an individual machine and receiving telematics data related to a slope angle for the individual machine. The method can further include receiving a machine type of the individual machine and selecting a compaction lookup table corresponding to the individual machine type. A compaction value is determined from the selected lookup table based on the total drive motor current and the slope angle.

19 Claims, 8 Drawing Sheets

400

402

|  | | Total Current | | | | | | | | | |
|---|---|---|---|---|---|---|---|---|---|---|---|
|  | | 10 | 20 | 30 | 40 | 50 | 60 | 70 | 80 | 90 | 100 |
| % Grade | 10 | 100 | 95 | 90 | 85 | 80 | 75 | 70 | 65 | 60 | 50 |
|  | 9 | 97 | 93 | 87 | 82 | 77 | 72 | 67 | 62 | 58 | 47 |
|  | 8 | 94 | 91 | 84 | 79 | 74 | 69 | 64 | 59 | 54 | 44 |
|  | 7 | 91 | 89 | 81 | 76 | 71 | 66 | 61 | 56 | 51 | 41 |
|  | 6 | 88 | 87 | 78 | 73 | 68 | 63 | 58 | 53 | 48 | 38 |
|  | 5 | 85 | 85 | 75 | 70 | 65 | 60 | 55 | 50 | 45 | 35 |
|  | 4 | 82 | 83 | 72 | 67 | 62 | 57 | 52 | 47 | 42 | 32 |
|  | 3 | 79 | 81 | 69 | 64 | 59 | 54 | 49 | 44 | 39 | 29 |
|  | 2 | 76 | 79 | 66 | 61 | 56 | 51 | 46 | 41 | 36 | 26 |
|  | 1 | 73 | 77 | 63 | 58 | 53 | 48 | 43 | 38 | 33 | 23 |
|  | 0 | 70 | 75 | 60 | 55 | 50 | 45 | 40 | 35 | 30 | 20 |
|  | -1 | 67 | 73 | 57 | 52 | 47 | 42 | 37 | 32 | 27 | 17 |
|  | -2 | 64 | 71 | 54 | 49 | 44 | 39 | 34 | 29 | 24 | 14 |
|  | -3 | 61 | 69 | 51 | 46 | 41 | 36 | 31 | 26 | 21 | 11 |
|  | -4 | 58 | 67 | 48 | 43 | 38 | 33 | 28 | 23 | 18 | 8 |
|  | -5 | 55 | 65 | 45 | 40 | 35 | 30 | 25 | 20 | 15 | 5 |
|  | -6 | 52 | 63 | 42 | 37 | 32 | 27 | 22 | 17 | 12 | 2 |
|  | -7 | 49 | 61 | 39 | 34 | 29 | 24 | 19 | 14 | 9 | 0 |
|  | -8 | 46 | 59 | 36 | 31 | 26 | 21 | 16 | 11 | 6 | 0 |
|  | -9 | 43 | 57 | 33 | 28 | 23 | 18 | 13 | 8 | 3 | 0 |
|  | -10 | 45 | 40 | 30 | 26 | 20 | 15 | 10 | 5 | 0 | 0 |

SYSTEMS AND METHODS FOR ESTIMATING MATERIAL COMPACTION BASED ON ELECTRIC MOTOR DRIVE POWER

TECHNICAL FIELD

This patent application is directed to estimating material compaction, and more specifically, to an on-board determination of compaction quality by relating machine drive power to material compaction.

BACKGROUND

The compaction of asphalt, soil, and other earthen material is an important step in the construction of road beds, pavements, foundations, dams, runways, landfill liners, etc. Compaction can improve the load bearing capacity of earthen materials, improve their strength, and their resistance to failure. In most construction processes, some quality assurance compaction test must be performed on a base material before further construction can take place on the compacted base material.

There are many known compaction quality assurance tests, such as walk out tests (walk out occurs when a compactor with a tipped roller becomes supported on the base material by the roller tips), penetrometer tests, and material density tests including nuclear density measurements. While these quality assurance techniques can help assure the compaction quality of a base material, they only check the compaction quality of a small portion of the compacted area which is typically a relatively large area. Thus, inadequate compaction in one area can go undetected after a quality assurance test at another location on the base material suggests that the material has been satisfactorily compacted. Furthermore, the down time involved in waiting for a quality assurance test to be performed after completion of a compaction process can increase inefficiencies and substantially increase the overall costs of a construction project.

Efforts have been made to avoid costly downtime associated with waiting for a quality assurance test to be performed. For example, U.S. Pat. No. 6,973,821 to Corcoran (hereinafter "Corcoran") contemplates generating compaction quality assurance data using on-board generated compaction quality control data. The quality control compaction data is based upon quantifying a sinkage deformation interaction between the compactor and the base material. The interaction might include monitoring an effective roller radius of the compactor, or an amount of energy transferred or consumed when the compactor moves over the base material, or measuring a rut depth caused by the compactor.

In one instance Corcoran quantifies a sinkage deformation interaction between the compactor and base material by measuring compactive energy which can be related to propelling power. The propelling power is determined by the product of hydraulic flow rate and hydraulic pressure of the compactor. Corcoran states that it is preferred to account for internal energy loss rates of the compactor due to bearings, gears, hydraulic fluid and the like. Accordingly, Corcoran includes additional sensor data and calculations. Furthermore, Corcoran is directed to a specific drive system, namely hydraulic drives.

Thus, there are still opportunities to improve on-board base material compaction estimates, particularly where electric drive systems are employed. The example systems and methods described herein are directed toward overcoming one or more of the deficiencies described above and/or other problems with the prior art.

SUMMARY

In some embodiments, a method for estimating material compaction can include creating compaction lookup tables based on total drive motor current and slope angle for each of a plurality of machine types. The method can include receiving telematics data related to total drive motor current for an individual machine and receiving telematics data related to a slope angle for the individual machine. The method can further include receiving a machine type of the individual machine and selecting a compaction lookup table corresponding to the individual machine type. A compaction value is determined from the selected lookup table based on the total drive motor current and the slope angle.

According to some aspects, the method can further comprise receiving a GPS location of the individual machine and mapping the compaction value with the GPS location of the individual machine. In some aspects, the method can further comprise activating a compaction indicator located on the individual machine when the compaction value exceeds a selected threshold. In certain aspects, selecting the compaction lookup table further comprises selecting the compaction lookup table based on a parameter value associated with the individual machine type. In some aspects, the parameter value associated with the individual machine type comprises tire pressure. According to certain aspects, the compaction lookup tables are empirically derived.

In some embodiments, a system for estimating material compaction can include one or more current sensors located on an individual machine, one or more slope angle sensors located on the individual machine, one or more processors, and one or more memory devices having instructions stored thereon. When executed, the instructions cause the processors to receive telematics data from the one or more current sensors related to total drive motor current for the individual machine and receive telematics data from the one or more slope angle sensors related to a slope angle for the individual machine. The instructions can also cause the processors to receive a machine type of the individual machine and select a compaction lookup table corresponding to the individual machine type. The instructions can also cause the processors to determine a compaction value from the selected lookup table based on the total drive motor current and the slope angle.

In some embodiments, one or more non-transitory computer-readable media can store computer-executable instructions that, when executed by one or more processors, cause the one or more processors to perform operations. The operations can include receiving telematics data related to total drive motor current for an individual machine and receiving telematics data related to a slope angle for the individual machine. The operations can also include receiving a machine type of the individual machine and selecting a compaction lookup table corresponding to the individual machine type. A compaction value from the selected lookup table is determined based on the total drive motor current and the slope angle.

BRIEF DESCRIPTION OF THE DRAWINGS

The systems and methods described herein may be better understood by referring to the following Detailed Description in conjunction with the accompanying drawings, in which like reference numerals indicate identical or functionally similar elements:

FIG. 4 is a representative compaction lookup table according to some embodiments of the disclosed technology;

Figure 1:
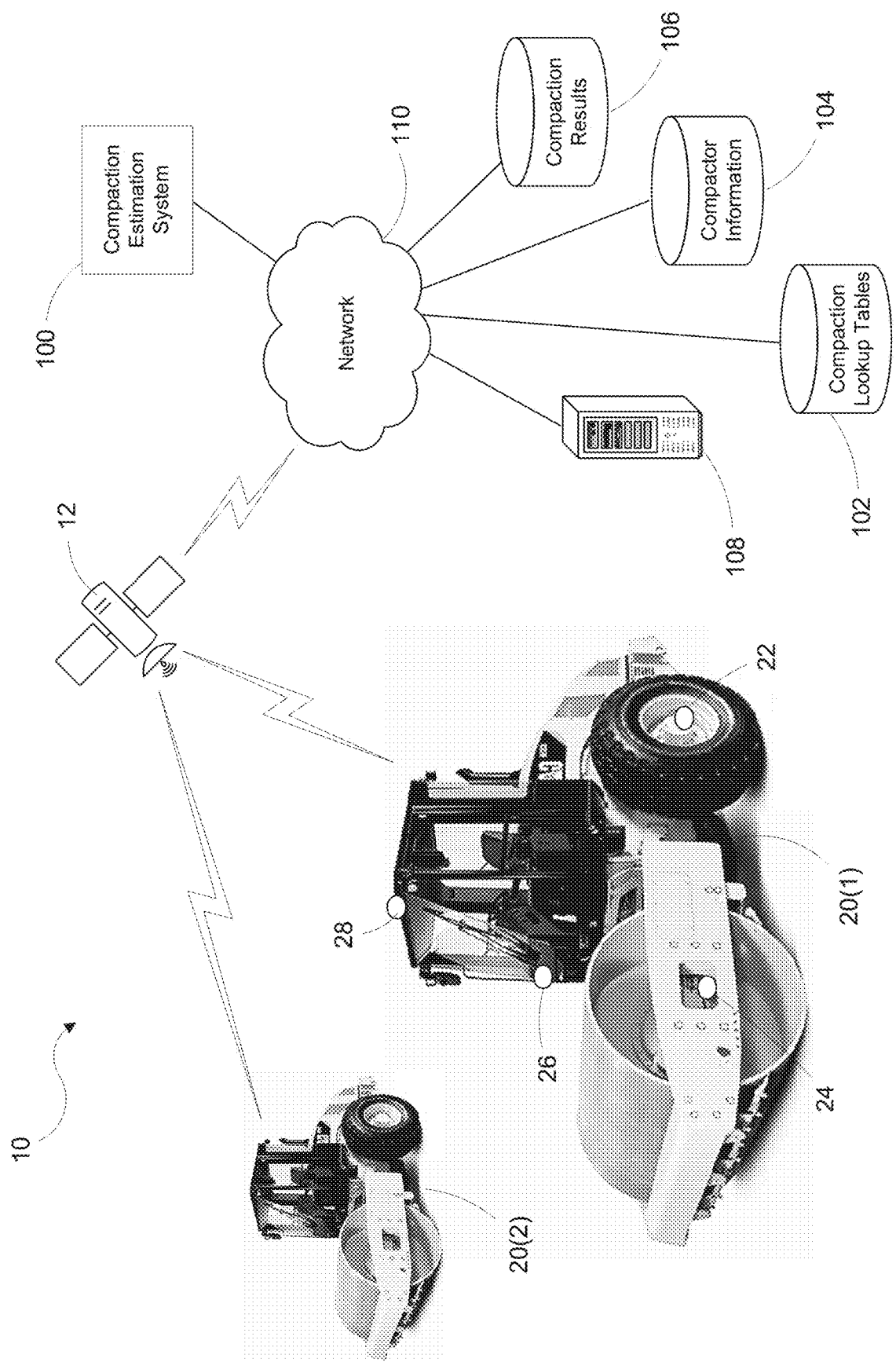
FIG. 1 is a diagram illustrating an overview of an environment in which some implementations can operate according to embodiments of the disclosed technology.

The headings provided herein are for convenience only and do not necessarily affect the scope of the embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to unnecessarily limit the embodiments described. On the contrary, the embodiments are intended to cover all suitable modifications, combinations, equivalents, and alternatives falling within the scope of this disclosure.

DETAILED DESCRIPTION

Various examples of the systems and methods introduced above will now be described in further detail. The following description provides specific details for a thorough understanding and enabling description of these examples. One skilled in the relevant art will understand, however, that the techniques and technology discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

Disclosed are methods and systems for estimating material compaction based on electric motor drive power. The compaction of a material affects the rolling resistance of the compactor. Thus, the power required to move the compactor over the material is related to the compaction of the material. In electrically driven compactors, the total current applied to the drive motors is therefore related to the compaction of the material. The disclosed technology uses empirically derived lookup tables to determine compaction based on total current and slope angle of the compactor. The disclosed technology is applicable to base materials such as soil and other earthen materials as well as asphalt. Using the disclosed methods to monitor compactor motor current can provide a more precise compaction estimate suitable for harder material such as asphalt, whereas conventional systems measuring hydraulic pressure are not precise enough to reliably estimate asphalt compaction. Compaction can be specified as density or unit weight (e.g., pounds per cubic foot). Compaction can also be specified as a percent of maximum density achieved in a lab. The compaction lookup tables can be based on known compaction testing methods and correlated to motor current and slope angle or grade, for example.

FIG. 1 illustrates an environment 10 in which some implementations of the compaction estimation system 100 can operate according to embodiments of the disclosed technology. The system environment 10 can include multiple machines, such as compactors 20(1) and 20(2), a satellite 12, compaction lookup tables database 102, a compactor information database 104, a compaction results database 106, a mapping system 108, and a network 110. The compaction estimation system 100 can be connected to the compaction lookup tables database 102, the compactor information database 104, the compaction results database 106, and the mapping system 108 via network 110. The compaction estimation system 100 and the mapping system 108 can receive telematics data from the compactors 20(1) and 20(2) via satellite 12. The telematics data can include sensor data from the compactors, such as a wheel motor current sensor 22, a roller motor current sensor 24, an inclinometer or angle sensor 26, and a geographic positioning system (GPS) sensor 28, to name a few. In some embodiments, at least some of the compaction estimation system components are located onboard the compactor. In some cases, the compaction lookup tables onboard the compactor can be periodically updated from a remote server (e.g., compaction lookup tables database 102).

Figure 2:
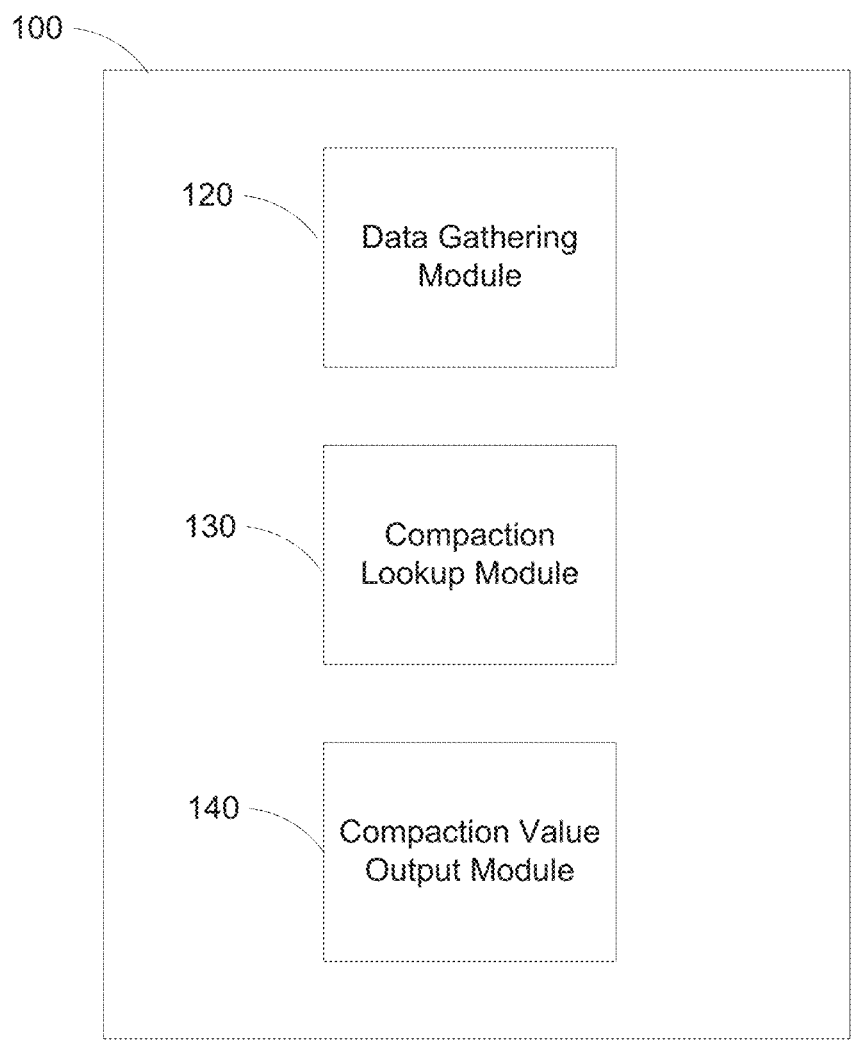
FIG. 2 is a block diagram illustrating an overview of a system for estimating material compaction according to some embodiments of the disclosed technology.

As shown in FIG. 2, the compaction estimation system 100 can comprise a Data Gathering Module 120, a Compaction Lookup Module 130, and a Compaction Value Output Module 140. In some embodiments, the Data Gathering Module 120 can be configured to collect compactor information (e.g., machine type, model number, and/or serial number) from the machine and/or database 104, slope angle or grade from the telematics data, and total current. In some embodiments, Module 120 can also gather additional parameters, such as tire pressure and ballast weight, for example. The Data Gathering Module 120 can also receive a GPS location associated with the slope angle and total current. The compaction estimation system 100 can receive information for multiple compactors working in an area and provide corresponding compaction values for each.

In some embodiments, the Compaction Lookup Module 130 is configured to receive the information gathered by Module 120 and select the corresponding lookup table. The lookup table can be selected based on machine type, model number, and/or additional parameter values. For example, the lookup table can be based on the model number and a ballast value. Thus, different ranges of ballast can have different lookup tables. Compaction Lookup Module 130 can determine the compaction value using the selected lookup table based on the received slope angle and current value.

In some embodiments, the Compaction Value Output Module 140 is configured to receive the compaction value and display and/or indicate the compaction value to a machine operator and/or a cite manager, for example. In some embodiments, the Output Module 140 can activate an indicator 27 (FIG. 3A) (e.g., a green light) in the cab of the compactor to indicate that the current location is sufficiently compacted. The indicator can be activated when the compaction value exceeds a predetermined threshold value, for example. In some embodiments, compaction values for multiple locations can be mapped and displayed for an area being compacted. Areas of varying compaction can be indicated by different colors. For example, areas that are sufficiently compacted can be highlighted in green while areas that have not been fully compacted can be highlighted in e.g., red or yellow. Areas that have not been visited by a compactor can be indicated in e.g., grey to indicate that there is not yet data for that location.

Figure 3A:
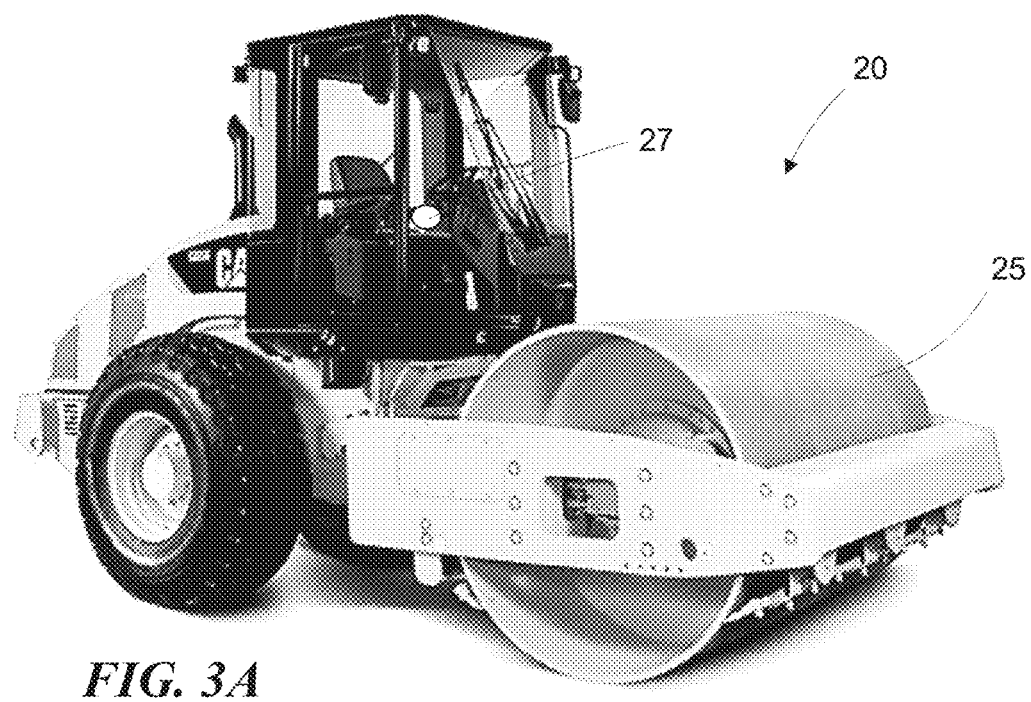
FIG. 3A is an illustration of a smooth drum compactor according to some embodiments of the disclosed technology.
Figure 3B:
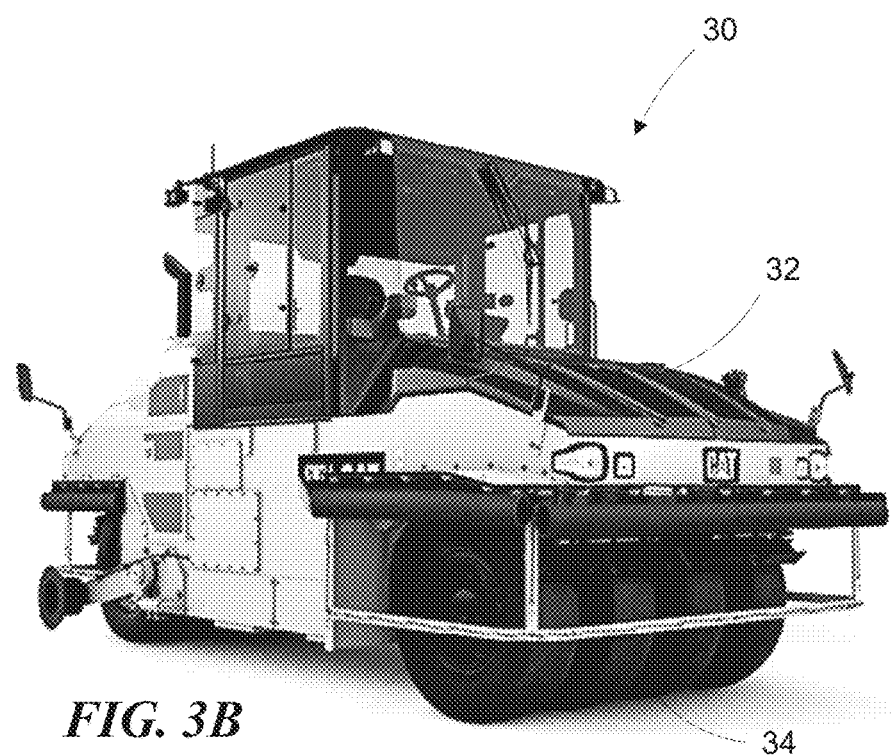
FIG. 3B is an illustration of a pneumatic roller compactor according to some embodiments of the disclosed technology.

FIGS. 3A and 3B illustrate two different types of compactors. Compactor 20 (FIG. 3A) is a smooth roller vibratory compactor. Compactor 30 (FIG. 3B) is an eight wheel pneumatic roller with modular ballast system providing a flexible operating weight. Each compactor has different features and as a result has different parameters that can have an impact on compaction. For example, the width and diameter of roller 25 can be used to select a lookup table for compactor 20. The pneumatic compactor 30 can carry different amounts of ballast 32. Compactor 30 can also have an air-on-the-run system 34 that enables the operator to quickly adjust tire pressures to increase or decrease static loads for optimal surface quality. Therefore, compactor 30 can have multiple lookup tables depending on the amount of ballast and air pressure. Thus, compactor 30 can have telemetry that monitors air pressure and/or ballast. In some embodiments, the air pressure and/or ballast values can be input by an operator.

FIG. 4 is a representative compaction lookup table 400 according to some embodiments of the disclosed technology. Table 400 is only an example lookup table, other values and ranges for current, grade, and compaction can be used. Furthermore, this is only one table; each compactor type or model can have many different lookup tables covering a variety of parameters, such as roller width, roller diameter, air pressure, and weight, to name a few. In one implementation of a compaction lookup table as depicted in FIG. 4, the Total Current 402 can be listed on the horizontal axis (columns), the % Grade 404 can be listed on the vertical axis (rows), and the compaction values 406 can be in percent compaction (e.g., percent of maximum density achieved in a lab). In one example, a compactor running a Total Current of 50 amps up a hill having a 5% grade would have a compaction value of 65%. In some embodiments, the Total Current 402 can be a summation of current from all of the drive motors on the compactor.

Figure 5:
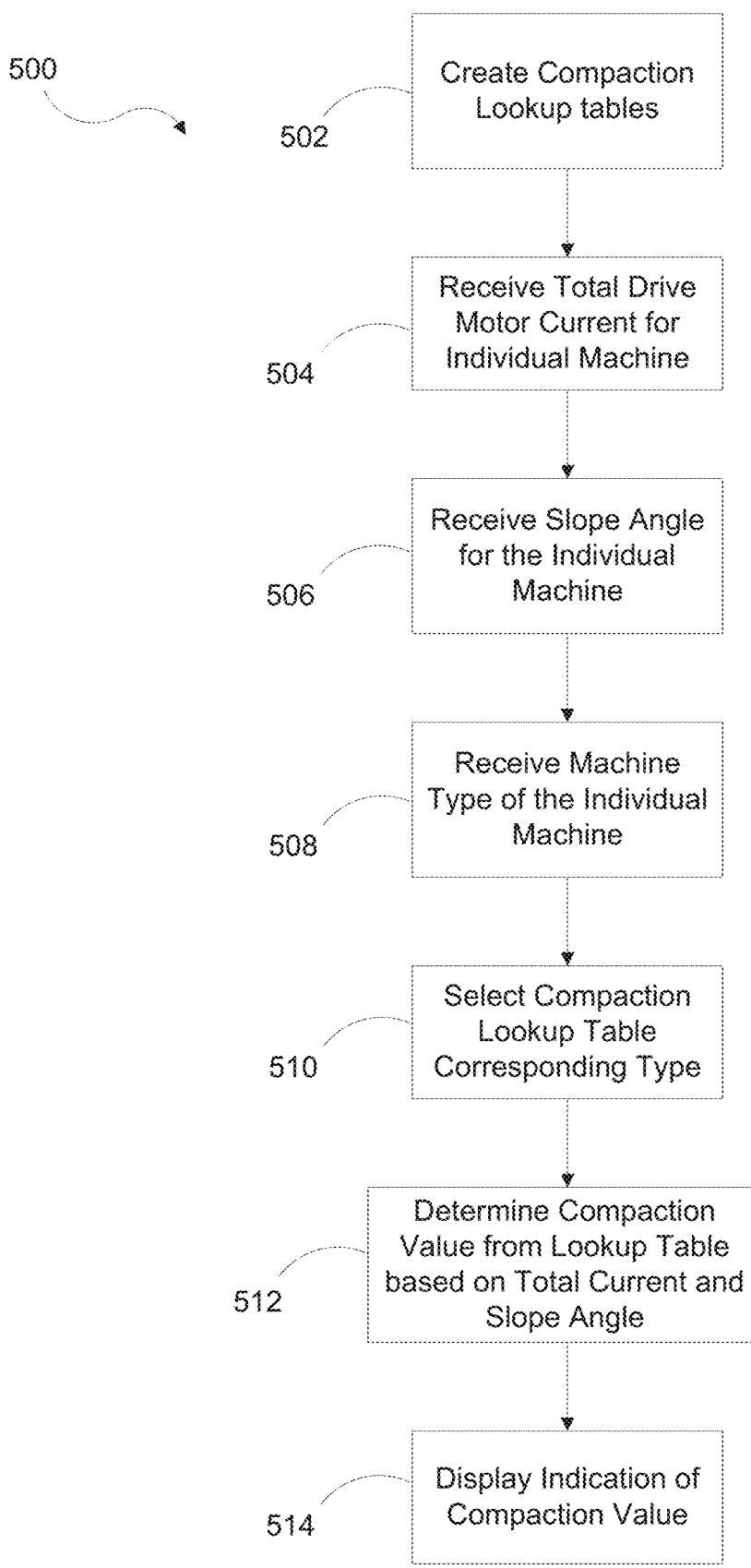
FIG. 5 is a flow diagram showing a method for estimating material compaction according to some embodiments of the disclosed technology.

FIG. 5 is a flow diagram showing a method 500 for estimating base material compaction based on electric motor drive power according to some embodiments of the disclosed technology. The method 500 can include creating, at step 502, compaction lookup tables for different compactors and associated operating parameters. The lookup tables can be derived empirically by correlating total current and slope angle with measured compaction values. At step 504, the method can include receiving a total drive motor current for an individual machine, and at step 506 the method includes receiving slope angle data from the machine. At step 508, the method includes receiving the machine type (e.g., a model number). The method also includes selecting a compaction lookup table corresponding to the machine type at step 510 and determining, at step 512, a compaction value from the table based on the total current and slope angle. At step 514 the method can include displaying an indication of the compaction value.

Suitable System

The techniques disclosed here can be embodied as special-purpose hardware (e.g., circuitry), as programmable circuitry appropriately programmed with software and/or firmware, or as a combination of special-purpose and programmable circuitry. Hence, embodiments may include a machine-readable medium having stored thereon instructions which may be used to cause a computer, a microprocessor, processor, and/or microcontroller (or other electronic devices) to perform a process. The machine-readable medium may include, but is not limited to, optical disks, compact disc read-only memories (CD-ROMs), magneto-optical disks, ROMs, random access memories (RAMs), erasable programmable read-only memories (EPROMs), electrically erasable programmable read-only memories (EEPROMs), magnetic or optical cards, flash memory, or other type of media/machine-readable medium suitable for storing electronic instructions.

Figure 6:
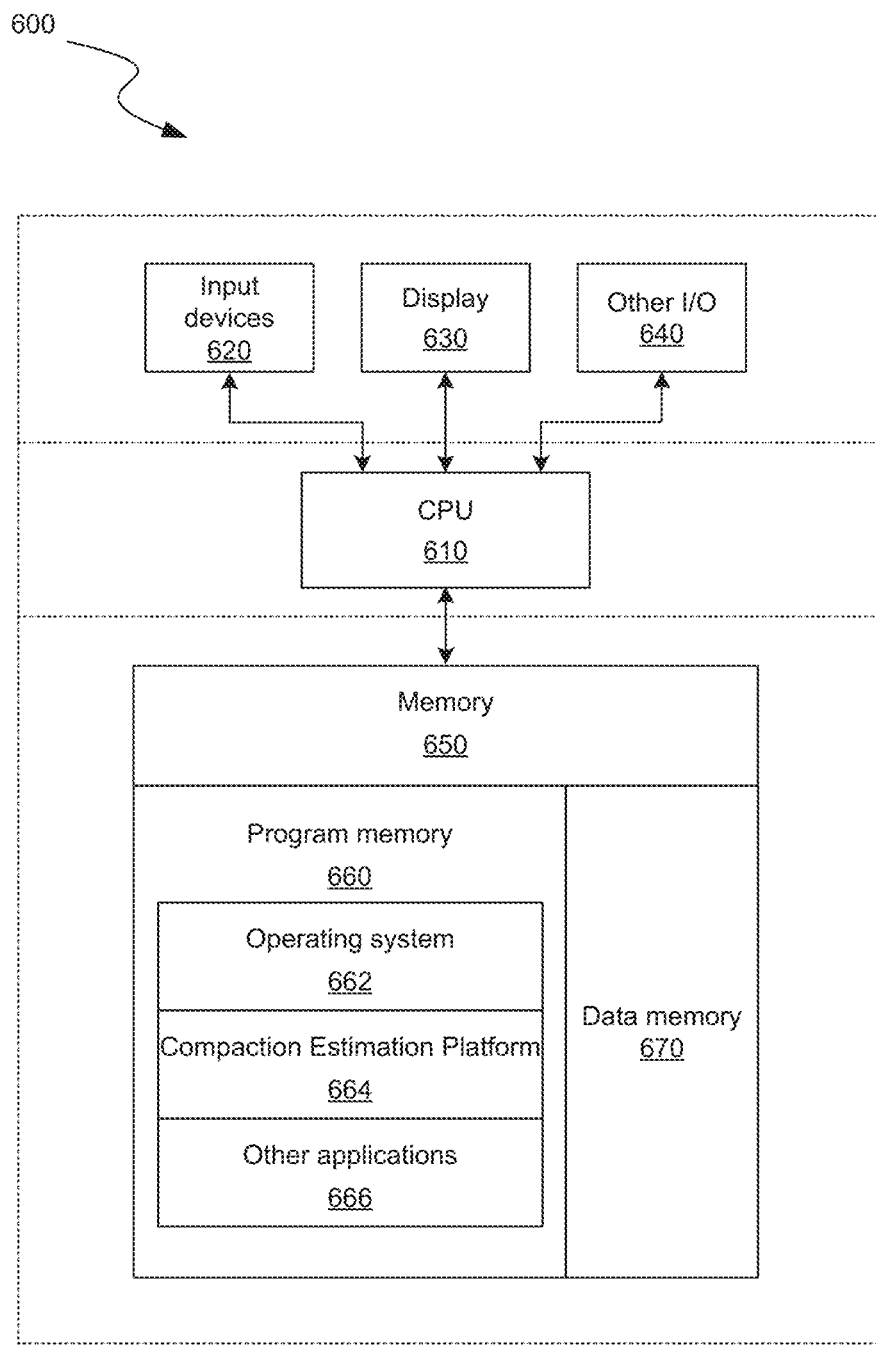
FIG. 6 is a block diagram illustrating an overview of devices on which some implementations can operate.

Several implementations are discussed below in more detail in reference to the figures. FIG. 6 is a block diagram illustrating an overview of devices on which some implementations of the disclosed technology can operate. The devices can comprise hardware components of a device 600 that estimates base material compaction, for example. Device 600 can include one or more input devices 620 that provide input to the CPU (processor) 610, notifying it of actions. The actions are typically mediated by a hardware controller that interprets the signals received from the input device and communicates the information to the CPU 610 using a communication protocol. Input devices 620 include, for example, machine telemetry, sensors, a mouse, a keyboard, a touchscreen, an infrared sensor, a touchpad, a wearable input device, a camera- or image-based input device, a microphone, or other user input devices.

CPU 610 can be a single processing unit or multiple processing units in a device or distributed across multiple devices. CPU 610 can be coupled to other hardware devices, for example, with the use of a bus, such as a PCI bus or SCSI bus. The CPU 610 can communicate with a hardware controller for devices, such as for a display 630. Display 630 can be used to display text and graphics. In some examples, display 630 provides graphical and textual visual feedback to a user. In some implementations, display 630 includes the input device as part of the display, such as when the input device is a touchscreen or is equipped with an eye direction monitoring system. In some implementations, the display is separate from the input device. Examples of display devices are: an LCD display screen; an LED display screen; a projected, holographic, or augmented reality display (such as a heads-up display device or a head-mounted device); and so on. Other I/O devices 640 can also be coupled to the processor, such as a network card, video card, audio card, USB, FireWire or other external device, sensor, camera, printer, speakers, CD-ROM drive, DVD drive, disk drive, or Blu-Ray device.

In some implementations, the device 600 also includes a communication device capable of communicating wirelessly or wire-based with a network node. The communication device can communicate with another device or a server through a network using, for example, TCP/IP protocols. Device 600 can utilize the communication device to distribute operations across multiple network devices.

The CPU 610 can have access to a memory 650. A memory includes one or more of various hardware devices for volatile and non-volatile storage, and can include both read-only and writable memory. For example, a memory can comprise random access memory (RAM), CPU registers, read-only memory (ROM), and writable non-volatile memory, such as flash memory, hard drives, floppy disks, CDs, DVDs, magnetic storage devices, tape drives, device buffers, and so forth. A memory is not a propagating signal divorced from underlying hardware; a memory is thus non-transitory. Memory 650 can include program memory 660 that stores programs and software, such as an operating system 662, Compaction Estimation Platform 664, and other application programs 666. Memory 650 can also include data memory 670 that can include database information, etc., which can be provided to the program memory 660 or any element of the device 600.

Some implementations can be operational with numerous other general purpose or special purpose computing system environments or configurations. Examples of well-known computing systems, environments, and/or configurations that may be suitable for use with the technology include, but are not limited to, personal computers, server computers, handheld or laptop devices, cellular telephones, mobile phones, wearable electronics, gaming consoles, tablet devices, multiprocessor systems, microprocessor-based systems, programmable consumer electronics, network PCs, minicomputers, mainframe computers, distributed computing environments that include any of the above systems or devices, or the like.

Figure 7:
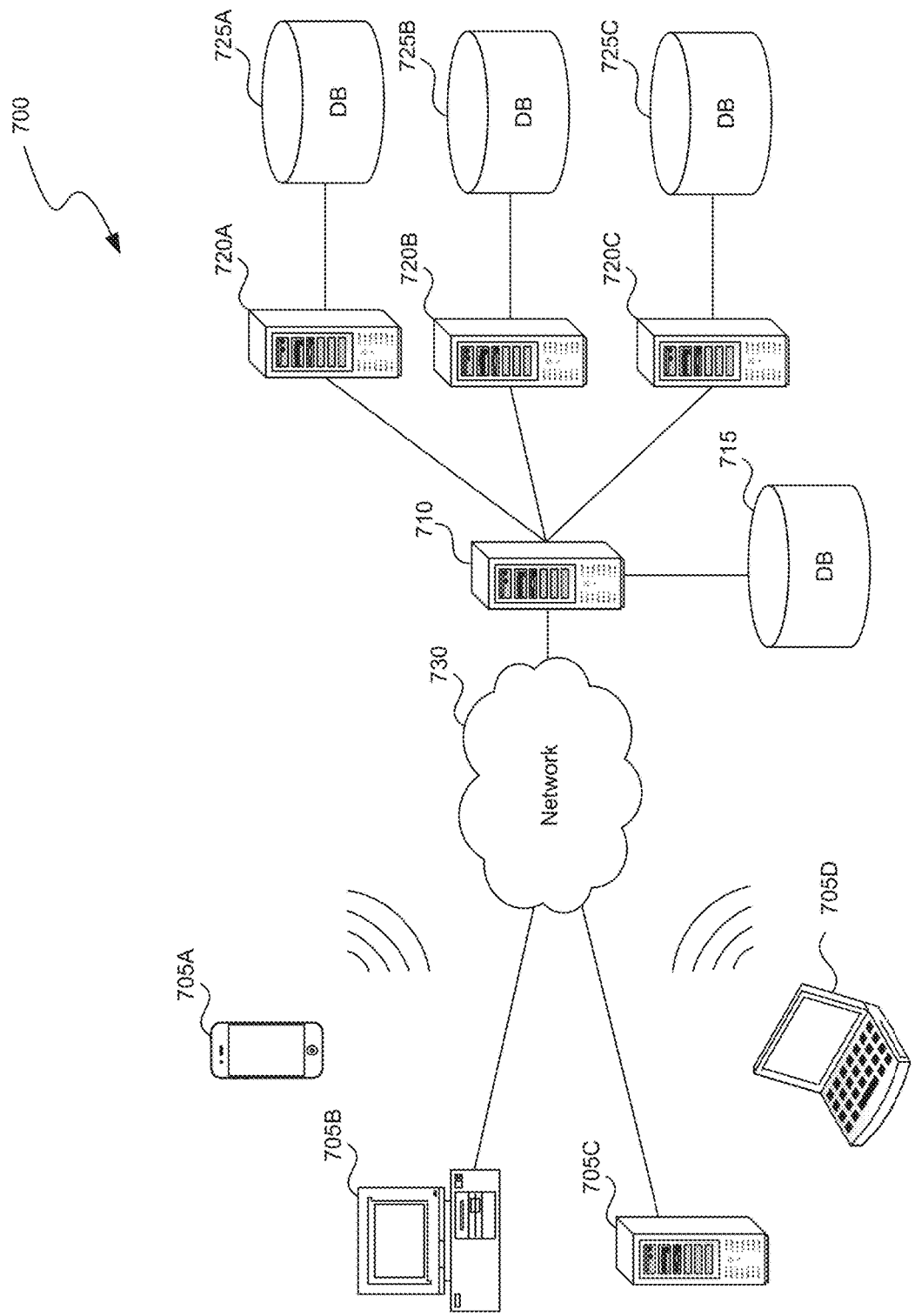
FIG. 7 is a block diagram illustrating an overview of an environment in which some implementations can operate.

FIG. 7 is a block diagram illustrating an overview of an environment 700 in which some implementations of the disclosed technology can operate. Environment 700 can include one or more client computing devices 705A-D, examples of which can include device 600. Client computing devices 705 can operate in a networked environment using logical connections through network 730 to one or more remote computers, such as a server computing device 710.

In some implementations, server computing device 710 can be an edge server that receives client requests and coordinates fulfillment of those requests through other servers, such as servers 720A-C. Server computing devices 710 and 720 can comprise computing systems, such as device 600. Though each server computing device 710 and 720 is displayed logically as a single server, server computing devices can each be a distributed computing environment encompassing multiple computing devices located at the same or at geographically disparate physical locations. In some implementations, each server computing device 720 corresponds to a group of servers.

Client computing devices 705 and server computing devices 710 and 720 can each act as a server or client to other server/client devices. Server 710 can connect to a database 715. Servers 720A-C can each connect to a corresponding database 725A-C. As discussed above, each server 720 can correspond to a group of servers, and each of these servers can share a database or can have their own database. Databases 715 and 725 can warehouse (e.g., store) information. Though databases 715 and 725 are displayed logically as single units, databases 715 and 725 can each be a distributed computing environment encompassing multiple computing devices, can be located within their corresponding server, or can be located at the same or at geographically disparate physical locations.

Network 730 can be a local area network (LAN) or a wide area network (WAN), but can also be other wired or wireless networks. Network 730 may be the Internet or some other public or private network. Client computing devices 705 can be connected to network 730 through a network interface, such as by wired or wireless communication. While the connections between server 710 and servers 720 are shown as separate connections, these connections can be any kind of local, wide area, wired, or wireless network, including network 730 or a separate public or private network.

Figure 8:
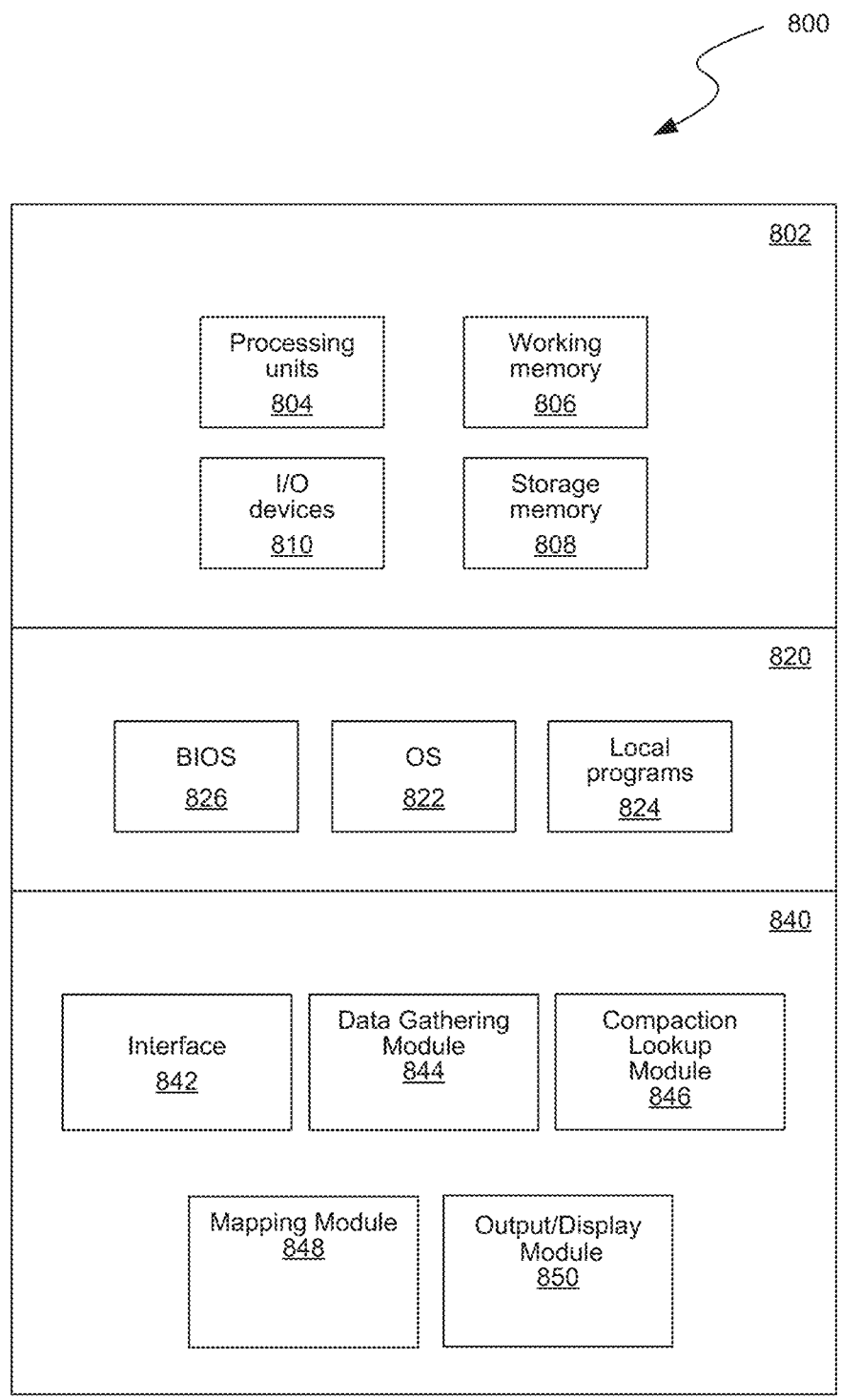
FIG. 8 is a block diagram illustrating components which, in some implementations, can be used in a system employing the disclosed technology.

FIG. 8 is a block diagram illustrating components 800 which, in some implementations, can be used in a system employing the disclosed technology. The components 800 include hardware 802, general software 820, and specialized components 840. As discussed above, a system implementing the disclosed technology can use various hardware, including processing units 804 (e.g., CPUs, GPUs, APUs, etc.), working memory 806, storage memory 808, and input and output devices 810. Components 800 can be implemented in a client computing device such as client computing devices 705 or on a server computing device, such as server computing device 710 or 720.

General software 820 can include various applications, including an operating system 822, local programs 824, and a basic input output system (BIOS) 826. Specialized components 840 can be subcomponents of a general software application 820, such as local programs 824. Specialized components 840 can include a Data Gathering Module 844, a Compaction Lookup Module 846, a Mapping Module 848, a Output/Display Module 850, and components that can be used for transferring data and controlling the specialized components, such as Interface 842. In some implementations, components 800 can be in a computing system that is distributed across multiple computing devices or can be an interface to a server-based application executing one or more of specialized components 840.

Those skilled in the art will appreciate that the components illustrated in FIGS. 6-8 described above, and in each of the flow diagrams discussed above, may be altered in a variety of ways. For example, the order of the logic may be rearranged, sub steps may be performed in parallel, illustrated logic may be omitted, other logic may be included, etc. In some implementations, one or more of the components described above can execute one or more of the processes described herein.

INDUSTRIAL APPLICABILITY

In some embodiments, a compaction estimation system can include a Data Gathering Module 844, a Compaction Lookup Module 846, a Mapping Module 848, and an Output/Display Module 850 (FIG. 8). In operation, the Data Gathering Module 844 can receive telematics data from one or more machines, such as compactors. The telematics data can include sensor data from the compactors, such as from motor current sensors, inclinometers, pressure sensors, etc. The Data Gathering Module 844 can also receive the machine type (e.g., a model number) and any other necessary parameter data depending on the specific features of the machine type/model.

The Compaction Lookup Module 846 can select a compaction lookup table corresponding to the machine type and/or parameter values. Module 846 determines a compaction value from the selected table based on the total current and slope angle.

The Mapping Module 848 can combine each compaction value with a corresponding location (e.g., GPS location) to create a map of an area to be compacted. The map can be color coded to indicate which areas are sufficiently compacted (e.g., green) and those that may need additional compaction (e.g., yellow).

The Output/Display Module 850 is configured to output an indication of whether an area under the compactor is sufficiently compacted with an indicator, such as an LED. In some embodiments, if the area is sufficiently compacted, the indicator displays a green light, otherwise the it displays a yellow light. The Output/Display Module 850 can also display the mapped compaction values on a monitor located in the cab of the compactor and/or at a remote location.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A method for estimating material compaction, comprising:
    obtaining compaction lookup tables with information about total drive motor current and slope angle for each of a plurality of machine types;
    receiving telematics data related to total drive motor current for an individual machine;
    receiving telematics data related to a slope angle for the individual machine;
    receiving a machine type of the individual machine;
    selecting a compaction lookup table corresponding to the individual machine type; and
    determining a compaction value from the selected lookup table based on the total drive motor current and the slope angle; and
    using the compaction value, operating the individual machine to adjust a static load on the individual machine.

2. The method of claim 1, further comprising receiving a GPS location of the individual machine and mapping the compaction value with the GPS location of the individual machine.

3. The method of claim 1, further comprising activating a compaction indicator located on the individual machine when the compaction value exceeds a selected threshold.

4. The method of claim 1, wherein selecting the compaction lookup table further comprises selecting the compaction lookup table based on a parameter value associated with the individual machine type.

5. The method of claim 4, wherein the parameter value associated with the individual machine type comprises tire pressure.

6. The method of claim 1, wherein the compaction lookup tables are empirically derived.

7. A system for estimating material compaction, comprising:
    one or more current sensors located on an individual machine;
    one or more slope angle sensors located on the individual machine;
    one or more processors; and
    one or more memory devices having stored thereon instructions that when executed by the one or more processors cause the one or more processors to:
        receive telematics data from the one or more current sensors related to total drive motor current for the individual machine;
        receive telematics data from the one or more slope angle sensors related to a slope angle for the individual machine;
        receive a machine type of the individual machine;
        select a compaction lookup table corresponding to the individual machine type; and
        determine a compaction value from the selected lookup table based on the total drive motor current and the slope angle; and
        using the compaction value, operate the individual machine to adjust a static load on the individual machine.

8. The system of claim 7, further comprising receiving a GPS location of the individual machine and mapping the compaction value with the GPS location of the individual machine.

9. The system of claim 7, further comprising a compaction indicator located on the individual machine that is activated when the compaction value exceeds a selected threshold.

10. The system of claim 7, wherein selecting the compaction lookup table further comprises selecting the compaction lookup table based on a parameter value associated with the individual machine type.

11. The system of claim 10, further comprising a parameter sensor located on the individual machine that receives data related to the parameter value.

12. The system of claim 10, wherein the parameter value associated with the individual machine type comprises tire pressure.

13. The system of claim 7, wherein the compaction lookup table is empirically derived.

14. One or more non-transitory computer-readable media storing computer-executable instructions that, when executed by one or more processors, cause the one or more processors to perform operations comprising:
- receiving telematics data related to total drive motor current for an individual machine;
- receiving telematics data related to a slope angle for the individual machine;
- receiving a machine type of the individual machine;
- selecting a compaction lookup table corresponding to the individual machine type;
- determining a compaction value from the selected lookup table based on the total drive motor current and the slope angle; and
- using the compaction value, operating the individual machine to adjust a static load on the individual machine.

15. The non-transitory computer-readable media of claim 14, further comprising receiving a GPS location of the individual machine and mapping the compaction value with the GPS location of the individual machine.

16. The non-transitory computer-readable media of claim 14, further comprising activating a compaction indicator located on the individual machine when the compaction value exceeds a selected threshold.

17. The non-transitory computer-readable media of claim 14, wherein selecting the compaction lookup table further comprises selecting the compaction lookup table based on a parameter value associated with the individual machine type.

18. The non-transitory computer-readable media of claim 17, wherein the parameter value associated with the individual machine type comprises tire pressure.

19. The non-transitory computer-readable media of claim 14, wherein the compaction lookup table is empirically derived.

* * * * *